(12) United States Patent
Zampaglione

(10) Patent No.: US 8,355,269 B1
(45) Date of Patent: Jan. 15, 2013

(54) PUSHED-RULE BIT CELLS WITH NEW FUNCTIONALITY

(75) Inventor: Michael Anthony Zampaglione, San Jose, CA (US)

(73) Assignee: eSilicon Corporation, Sunnyvale, CA (US)

( * ) Notice: Subject to any disclaimer, the term of this patent is extended or adjusted under 35 U.S.C. 154(b) by 0 days.

(21) Appl. No.: 12/592,472

(22) Filed: Nov. 24, 2009

Related U.S. Application Data

(60) Provisional application No. 61/200,146, filed on Nov. 24, 2008.

(51) Int. Cl.
*G11C 15/00* (2006.01)
(52) U.S. Cl. ......... 365/49.16; 365/154; 365/51; 365/63; 365/168
(58) Field of Classification Search ............... 365/49.16, 365/154, 51, 49, 63, 168
See application file for complete search history.

(56) References Cited

U.S. PATENT DOCUMENTS

| | | | |
|---|---|---|---|
| 6,882,007 B2 * | 4/2005 | Landgraf et al. | 257/329 |
| 7,236,396 B2 * | 6/2007 | Houston et al. | 365/185.07 |
| 7,286,379 B1 * | 10/2007 | Sun | 365/49.17 |
| 7,355,873 B2 * | 4/2008 | Nii et al. | 365/49.1 |
| 7,710,808 B2 * | 5/2010 | Kushida et al. | 365/210.13 |
| 7,812,373 B2 * | 10/2010 | Bauer et al. | 257/206 |
| 7,816,740 B2 * | 10/2010 | Houston et al. | 257/369 |

* cited by examiner

*Primary Examiner* — Connie Yoha
(74) *Attorney, Agent, or Firm* — Fenwick & West LLP

(57) ABSTRACT

A memory bit cell suitable for use in semiconductor integrated circuits that utilizes pushed design rules and layout geometries optimized by a semiconductor foundry for standard memory bit cells and edge-cell structures that provides a different functionality from that provided by the foundry standard bit cell. This different functionality is achieved by interconnecting the elements of one or a plurality of standard foundry bit cells and edge cells to implement a different circuit with different operation from the original bit cells and edge cells. The positioning and interconnection of the standard bit cells and edge cells are implemented in a manner so as to maintain the same periodic geometric proximity effects to the maximum degree possible. A preferred embodiment of this invention is to interconnect two standard foundry six-transistor SRAM bit cells and two edge cells to create a Ternary Content Addressable Memory bit cell with mask and compare functionality in addition to bit storage functionality.

28 Claims, 4 Drawing Sheets

PUSHED-RULE BIT CELLS WITH NEW FUNCTIONALITY

CROSS-REFERENCE TO RELATED APPLICATIONS

This application claims the benefit of provisional patent application entitled Provisional Patent Application for Pushed-rule Bit Cells with New Functionality filed 2008 Nov. 24, Application No. 61/200,146 by the present inventor.

FEDERALLY SPONSORED RESEARCH

Not Applicable

SEQUENCE LISTING OF PROGRAM

Not Applicable

BACKGROUND OF THE INVENTION

1. Field of Invention

This invention relates to the design and layout of semiconductor memory bit cells using design rules that are smaller than the standard logic design rules for a given process technology node in order to reduce area per bit and improve performance.

2. Prior Art

Prior art for many types of memory bit cells such as Content Addressable Memories (CAMs) and Register File Memories use bit cells laid out using the standard logic design rules for a given process technology node such as 28-nanometer. This has the advantage that the design rules are proven to produce high yield and good reliability so the memory bit cells constructed in compliance with these rules also will have high yield and good reliability.

Most semiconductor fabrication companies also invest significant development effort to develop bit cells for Static Random Access Memories (SRAMs) with tighter design rules in order to improve bit density and memory performance. Typically this requires extensive experimentation and optical-proximity and contour simulations to adequately model and control geometric proximity effects. This effort is worthwhile since most integrated circuits use large amounts of memory so there is a huge multiplier for bit-cell area savings.

This invention leverages the development effort expended on SRAM bit-cell optimization by applying the results of that effort to new bit cell types with new functionality compared with SRAM bit cells such as CAM and Register File Memories. This is accomplished by reusing the geometrical structures optimized for SRAMs including the bit cells themselves and edge-cell structures and strap cells.

OBJECTS AND ADVANTAGES

Area, power dissipation and frequency of operation are key metrics for all integrated circuits. Memory area is especially important because memories occupy a large fraction of the total area of most modern integrated circuits. Often memory performance also limits the maximum frequency of operation of integrated circuits and memory power dissipation is a major contributor to overall power dissipation of integrated circuits. Power dissipation is particularly important for CAMs since the match operations characteristic of all CAMs produce large active currents when match lines are charged and discharged.

Reducing the area of the memory bit cell also improves the performance and reduces the active power dissipation. This is due to the fact that smaller areas reduce the parasitic capacitances that must be charged and discharged during operation thereby reducing power dissipation. Smaller bit-cell dimensions also reduce the length of word lines and bit lines thereby reducing the RC time constant of these signal lines. This reduces the timing intervals for read operations and write operations enabling higher frequencies of operation.

This invention makes it possible to take advantage of time and effort invested to reduce the area of SRAM bit cells and apply it to other bit cells with new functionality such as CAM bit cells. The smaller CAM bit cells also have the advantage that they improve performance and reduce power dissipation for the reasons cited.

SUMMARY

This invention provides improved layouts for memory bit cells for semiconductor integrated circuit applications that enable smaller area, better performance, and lower power than could otherwise be achieved with standard foundry layout rules. This invention takes advantage of pushed layout design rules that foundries develop for layouts of standard memory bit cells such as the six-transistor bit cell for Single-Port Static Random Access Memories (SRAMs) and layouts for the associated edge-cell in order to construct new bit cells with different functionality from the foundry-provided bit cells. A preferred embodiment of this invention is to interconnect the layouts for two six-transistor SRAM bit cells and the layouts for their two associated edge-cell layouts to produce a bit cell for a Ternary Content Addressable Memory (TCAM). One SRAM bit cell stores the data bit, the second bit cell stores the mask information for that bit and the compare transistors are constructed from the edge cell layouts. The six-transistor SRAM bit cells and the edge-cell layouts are positioned so as to maintain the periodic geometric proximity characteristics of the original SRAM bit cell array. This enables robust high-yield manufacture of the TCAM bit cell with tighter design rules than would otherwise be possible. The smaller area and smaller parasitic capacitances and resistances of the resulting bit cell layout enable better performance and lower power for the memories comprised of this bit cell.

DRAWINGS

Figures

DETAILED DESCRIPTION

Preferred Embodiment—FIGS. 1, 2, 3, 4, 5, and 6

Figure 6:
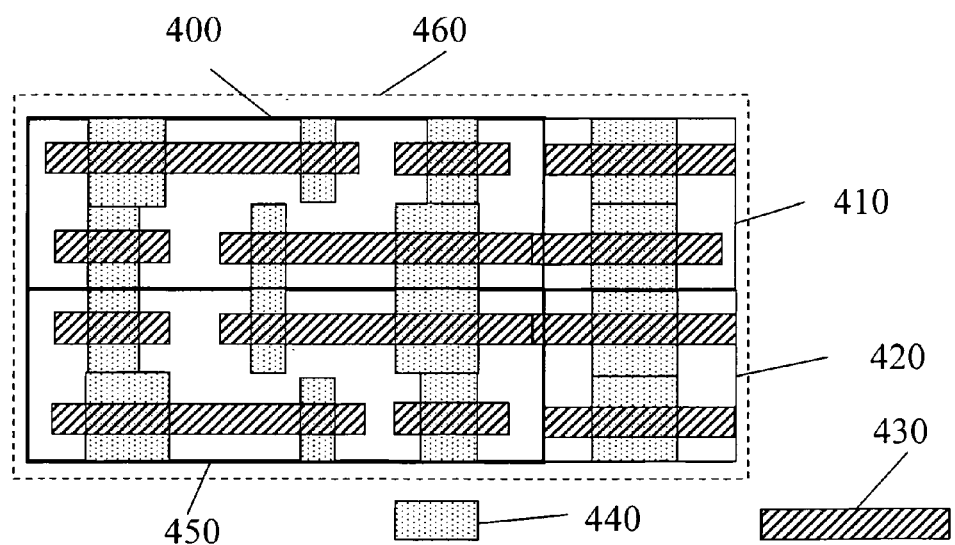
FIG. 6 shows a layout view of the base layers of a TCAM bit cell constructed of two 6T SRAM bit cells arrayed with two half compare cells.

An example of the base layout layers of a preferred embodiment of the pushed rule bit cell with new functionality of the present invention is illustrated in FIG. 6. Active layer geometries are denoted by a dotted pattern 440 FIG. 6. Polysilicon geometries are denoted by a crosshatch pattern 430 FIG. 6. In the preferred embodiment the bit cell has the functionality of a TCAM bit cell 50 illustrated in FIG. 2. The TCAM bit cell 460 FIG. 6 is constructed from a 6T SRAM bit-cell layout 450 FIG. 6, a mirrored 6T SRAM bit-cell layout 400 FIG. 6, a half compare cell layout 420 FIG. 6, and a mirrored half compare cell layout 410 FIG. 6.

Figure 1:
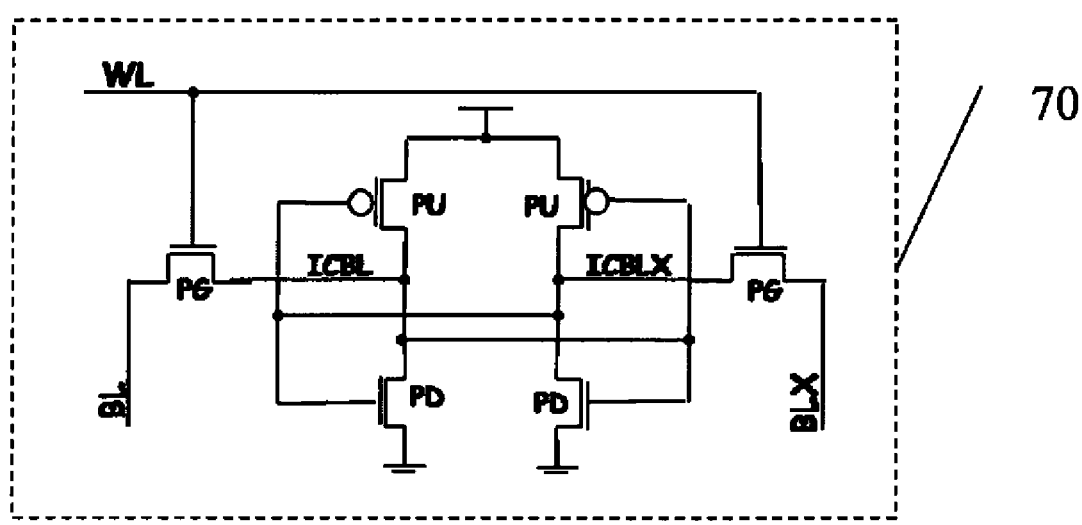
FIG. 1 shows a schematic representation of a 6T SRAM bit cell.
Figure 2:
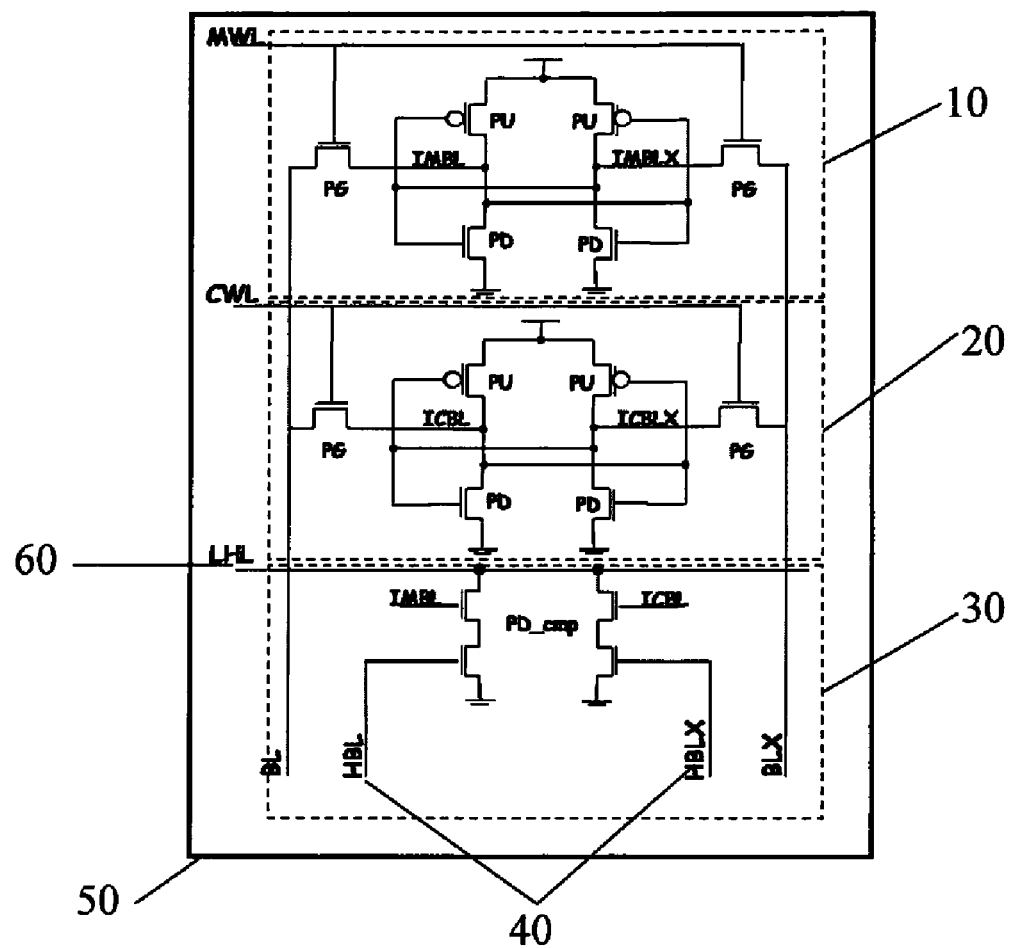
FIG. 2 shows a schematic representation of a TCAM bit cell.
Figure 4:
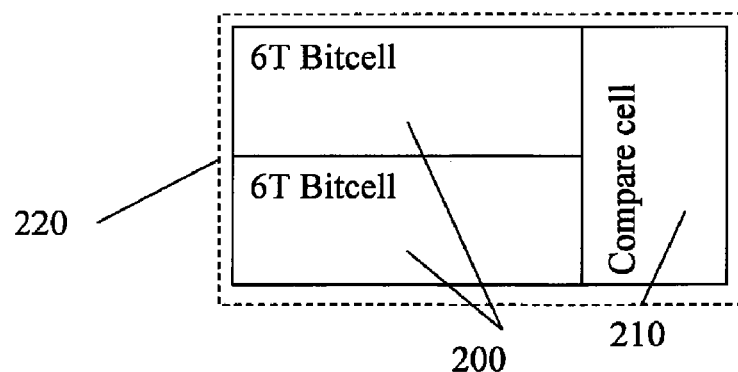
FIG. 4 shows a floor plan of a TCAM bit cell constructed of two 6T SRAM bit cells arrayed with a compare cell.

A 6T bit-cell schematic 70 is illustrated in FIG. 1. The TCAM bit-cell schematic 50 in FIG. 2 is composed of three parts: two 6T bit cells 10 and 20, and one compare circuit 30. FIG. 4 illustrates a TCAM bit-cell floor plan showing the TCAM bit cell 220 to be composed of two 6T SRAM bit cells 200 arrayed with a compare cell 210.

Figure 3:
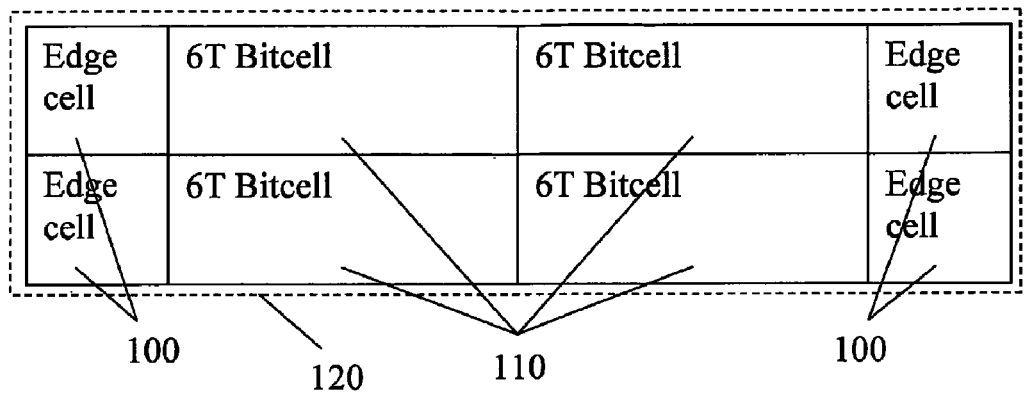
FIG. 3 shows a floor plan of four 6T SRAM bit cells arrayed with edge cells.
Figure 5:
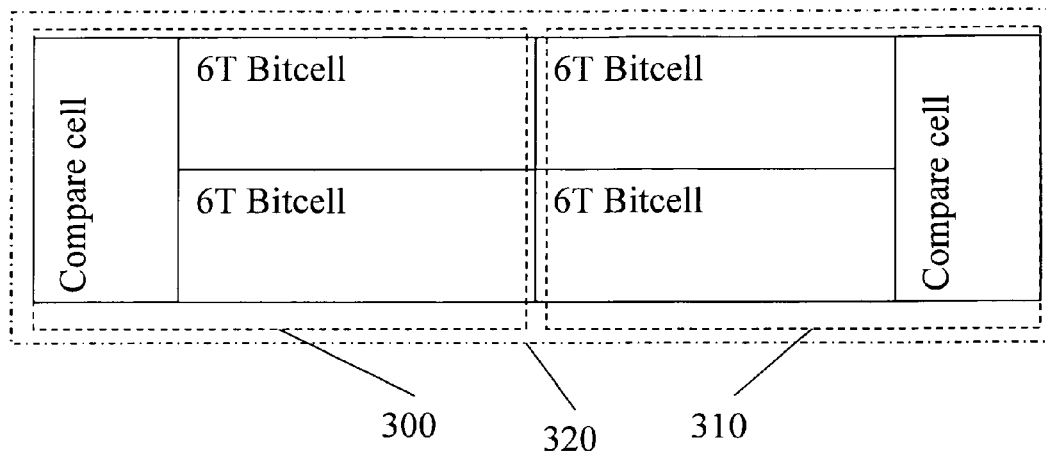
FIG. 5 shows a floor plan of an array of two TCAM bit cells.

A memory array floor plan illustrated in FIG. 3 is composed of four 6T SRAM bit cells 110 arrayed with four edge cells 100. A floor plan of a TCAM bit-cell array illustrated in FIG. 5 shows a TCAM bit cell 310 arrayed with a mirrored TCAM bit cell 300. The structure of the TCAM bit-cell array 320 FIG. 5 is similar to the 6T bit-cell array with edge cells 120 in FIG. 3.

Operation of the Preferred Embodiment

In the preferred embodiment the pushed rule bit cell with new functionality implements a TCAM bit cell. The function of a 6T SRAM bit cell 70 FIG. 1 is to store one bit of information. The data is stored as a binary state of 0 or 1. A TCAM bit cell 50 FIG. 2, consists of two 6T SRAM bit cells 10 and 20, and a compare circuit 30. The TCAM bit cell 50 stores three states, 0, 1, and X. The compare circuit 30 compares the TCAM bit cell stored state against its compare data inputs 40. If the data inputs 40 match the stored state, the TCAM bit cell 50 will set its compare match signal 60 to a 1 state. If the data inputs 40 do not match the stored state the TCAM bit cell 50 will set its compare match signal 60 to a 0 state.

CONCLUSION, RAMIFICATIONS, AND SCOPE

Bit cell layouts for semiconductor memories are carefully optimized for area, performance, and power because typically there are very large numbers of them on integrated circuits and their impact on the area, performance, and power of the integrated circuit is disproportionately large. Semiconductor foundries typically provide optimized layouts for a small number of memory bit cell types that are used in large numbers. These memory types usually include at least one six-transistor (6T) bit cell for standard one-port Static Random Access Memories (SRAMs). Often more than one optimized 6T SRAM bit cell is provided. Frequently the foundry provides a bit cell optimized for minimum area and a second bit cell optimized for high performance, which has larger transistors and higher current to discharge bit lines faster. In addition to the single-port SRAM bit cell(s), foundries often provide at least one optimized eight-transistor (8T) dual-port SRAM bit cell.

These optimized bit cells provided by the foundries utilize design rules that are tighter than the design rules used for layouts of random transistors elsewhere on the integrated circuit. This means that feature sizes and spacings are reduced from what is required elsewhere on the integrated circuit. Usually the tighter design rules would cause reduced yield, but memory bit cells are special in that they are arrayed together in rows and columns of bit cells that have well-defined geometric proximity effects. This makes it possible to optimize the layouts and the optical proximity corrections to maximize the fidelity of the features photolithographically printed on the wafers and subsequently etched onto the silicon chips. The net result is that the area of the memory bit cells can be reduced by using pushed layout rules while maintaining manufacturing yields.

Many other types of memory bit cells are used on integrated circuits including multi-port SRAM cells, register file cells, Read Only Memory (ROM) cells, and Content Addressable Memory (CAM) Cells. Typically these bit cells do not use pushed rules. The reason is that significant engineering effort is needed to optimize the pushed rules for memory bit cells. So even though these other bit cells could benefit from pushed rules typically effort is not invested to develop them based on cost benefit analyses.

In addition to developing pushed-rule bit cells foundries also typically develop edge-cell structures used to terminate the edges of the array of memory bit cells. This is required to avoid discontinuities at the edges of the arrays that could otherwise disrupt the periodic geometric proximity effects that are critical to successfully implement the pushed-rule bit cells. Often these edge-cell structures also employed pushed rules in order to achieve the same row and column pitches of the memory bit cells.

This application teaches how to combine pushed-rule bit cells and edge-cells provided by foundries to create new memory bit cells with new functionality. The advantage of this invention is that it makes it possible to leverage work already done by the foundry to achieve high density, high-performance bit cells using pushed rules to other memory bit cells with new functionality. The bit cells and edge cells are combined in such a way as to maintain the proximity effects in the array so the pushed rules can be used for the new functionality while maintaining high yield. One preferred embodiment of this invention is to combine two 6T bit cells and their associated edge cells to form a Ternary CAM (TCAM) bit cell. A TCAM is a memory that enables searching the data content of the memory array for matches with an applied data pattern. Each bit cell in the TCAM has a data storage bit, a mask bit, and compare transistors to determine whether the data in the data storage bit is a match to the applied bit on the query bit lines. The mask bit determines whether or not the data storage bit is included in the compare or not. From the perspective of the compare operation each TCAM bit cell can have three states—ONE, ZERO, or DON'T CARE. This is the rationale for the use of the TCAM nomenclature. It designates a bit cell with three potential comparison states; hence, the use of the term Ternary. This application teaches how to combine two 6T SRAM bit cell layouts with pushed rules together with edge cell layouts to comprise the TCAM bit cell. One 6T SRAM bit cell comprises the storage bit, the second 6T SRAM bit cell comprises the mask bit, and the edge cell transistors comprise the compare function. The 6T SRAM bit cells and edge cells are configured in such a manner as to maintain the periodic geometric proximity pattern already proven for the 6T SRAM bit cell.

The improved bit-cell layout of this invention results in a memory with smaller area, improved performance, and reduced power dissipation. This is accomplished without the need for a major development effort similar to the effort required to develop the original pushed-rule bit cell. The advantages of a pushed-rule bit cell with new functionality are achieved without incurring the associated cost for development. The example of a TCAM bit cell has been used for the purposes of providing a concrete example of this invention, but it can be applied to other memory types such as multi-port register files. The application of this invention is not constrained to the example of new functionality provided by the TCAM bit cell.

The invention claimed is:

1. A composite memory bit cell suitable for use in integrated circuits that utilize pushed layout rules comprising:
   two foundry-supplied bit-cell layouts for two six-transistor SRAM bit cells, said foundry-supplied bit-cell layouts utilizing pushed layout rules, and
   two foundry-supplied edge-cell layouts compatible with the layouts for said SRAM bit-cell layouts, and
   minor bit-cell layout modifications and minor edge-cell layout modifications to enable functionality as data storage bits, mask bits and as compare transistors, and
   interconnections between said two foundry-supplied bit-cell layouts and said two modified foundry-supplied edge-cell layouts to constitute the functionality of a Ternary Content Addressable Memory bit cell such that the first of said six-transistor SRAM bit cells stores the data bit, while the second of said six transistor SRAM bit cells stores the mask bit and the transistors in said modified edge-cell layouts comprise the compare function of the Ternary Content Addressable Memory, and
   whereby said composite layout of said composite bit cell provides enhanced functionality with a layout that is optimized for area and performance by virtue of maintaining the salient layout features of the original foundry-supplied bit-cell and edge-cell layouts.

2. A composite memory bit cell suitable for use in an integrated circuit, the integrated circuit laid out using standard logic design rules, the composite memory bit cell comprising at least two pushed-rule memory bit cells laid out using pushed layout design rules, the composite memory bit cell implementing a logic function that is different than a logic function implemented by any of the pushed-rule memory bit cells.

3. The composite memory bit cell of claim 2 wherein the pushed-rule memory bit cells comprise a six-transistor SRAM bit cell.

4. The composite memory bit cell of claim 2 wherein the pushed-rule memory bit cells comprise a single-port SRAM bit cell.

5. The composite memory bit cell of claim 2 wherein the pushed-rule memory bit cells comprise an eight-transistor SRAM bit cell.

6. The composite memory bit cell of claim 2 wherein the pushed-rule memory bit cells are laid out in a manner that preserves geometric proximity characteristics of the pushed-rule memory bit cells.

7. The composite memory bit cell of claim 2 further comprising circuitry based on an edge cell associated with the pushed-rule memory bit cells.

8. The composite memory bit cell of claim 2 further comprising circuitry based on a strap cell associated with the pushed-rule memory bit cells.

9. The composite memory bit cell of claim 2 wherein the composite memory bit cell occupies less area than a composite memory bit cell that implements the same logic function but laid out using standard logic design rules.

10. The composite memory bit cell of claim 2 wherein the composite memory bit cell consumes less power than a composite memory bit cell that implements the same logic function but laid out using standard logic design rules.

11. The composite memory bit cell of claim 2 wherein the composite memory bit cell operates at a higher frequency than a composite memory bit cell that implements the same logic function but laid out using standard logic design rules.

12. The composite memory bit cell of claim 2 wherein the pushed-rule memory bit cells are foundry-supplied pushed-rule memory bit cells.

13. The composite memory bit cell of claim 2 wherein the pushed-rule memory bit cells are designed for a 28-nanometer or smaller process technology node.

14. The composite memory bit cell of claim 2 wherein the composite memory bit cell is a content addressable memory.

15. The composite memory bit cell of claim 2 wherein the composite memory bit cell is a ternary content addressable memory.

16. The composite memory bit cell of claim 2 wherein the composite memory bit cell is a register file memory.

17. The composite memory bit cell of claim 2 wherein the composite memory bit cell is a multi-port memory.

18. A ternary content addressable memory (TCAM) suitable for use in an integrated circuit, the integrated circuit laid out using standard logic design rules, the TCAM comprising an array of TCAM bit cells, each TCAM bit cell comprising:
   a first pushed-rule memory bit cell for storing a data bit;
   a second pushed-rule memory bit cell for storing a mask bit; and
   compare circuitry coupled to the first and second pushed-rule memory bit cells, for comparing the data bit to an applied bit, wherein the mask bit determines whether to include the data bit in the comparison.

19. The TCAM of claim 18 wherein each of the first and second pushed-rule memory bit cells comprises an SRAM bit cell.

20. The TCAM of claim 19 wherein each of the first and second pushed-rule memory bit cells comprises a six-transistor SRAM bit cell.

21. The TCAM of claim 20 wherein the first pushed-rule memory bit cell is a mirror of the second pushed-rule memory bit cell.

22. The TCAM of claim 20 wherein the compare circuitry is based on an edge cell associated with the six-transistor SRAM bit cell.

23. The TCAM of claim 18 wherein the pushed-rule memory bit cells are laid out in a manner that preserves geometric proximity characteristics of the pushed-rule memory bit cells.

24. The TCAM of claim 18 wherein the composite memory bit cell occupies less area than a composite memory bit cell that implements the same logic function but laid out using standard logic design rules.

25. The TCAM of claim 18 wherein the composite memory bit cell consumes less power than a composite memory bit cell that implements the same logic function but laid out using standard logic design rules.

26. The TCAM of claim 18 wherein the composite memory bit cell operates at a higher frequency than a composite memory bit cell that implements the same logic function but laid out using standard logic design rules.

27. The TCAM of claim 18 wherein the pushed-rule memory bit cells are foundry-supplied pushed-rule memory bit cells.

28. The TCAM of claim 18 wherein the pushed-rule memory bit cells are designed for a 28-nanometer or smaller process technology node.

* * * * *